United States Patent
Cho

(10) Patent No.: US 6,870,412 B2
(45) Date of Patent: Mar. 22, 2005

(54) MTCMOS FLIP-FLOP CIRCUIT CAPABLE OF RETAINING DATA IN SLEEP MODE

(75) Inventor: Sung-We Cho, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/674,847

(22) Filed: Sep. 29, 2003

(65) Prior Publication Data

US 2004/0090256 A1 May 13, 2004

(30) Foreign Application Priority Data

Nov. 7, 2002 (KR) ................................ 10-2002-0068932

(51) Int. Cl.[7] ......................... H03K 3/289; H03K 3/359
(52) U.S. Cl. ....................................... 327/202; 327/203
(58) Field of Search ................................. 327/199, 200, 327/202, 203, 208–212, 218

(56) References Cited

U.S. PATENT DOCUMENTS 6,246,265 B1 * 6/2001 Ogawa ......................... 326/95
6,492,854 B1 * 12/2002 Ku et al. ..................... 327/202
6,538,471 B1 * 3/2003 Stan et al. ..................... 326/46

OTHER PUBLICATIONS

IEEE Journal of Solid State Circuit, vol. 32, No. 6, Satoshi Shigematsu, 1997, entitled A 1–V High–Speed MTCMOS Circuit Scheme for Power–Down Application Circuits.

* cited by examiner

Primary Examiner—Tuan T. Lam
(74) Attorney, Agent, or Firm—Marger Johnson & McCollom, P.C.

(57) ABSTRACT

The present invention relates to a flip-flop circuit employing an MTCMOS technology comprising a master latch unit and a slave latch unit, for latching input data and outputting the data under the control of an internal clock signal, wherein an output of the flip-flop circuit retains a state just before the admission to sleep mode when the state of the system is converted from sleep mode to active by means of making a data state of an input terminal of a master latch into the same state as an inversed data state of an input terminal of a slave latch circuit in sleep mode and storing it. The flip-flop circuit employing the MTCMOS technology in accordance with the present invention is capable of retaining a state just before the sleep mode when the state of the system is converted from sleep mode to active mode by using the sleep mode control signal by means of adding the feedback circuit to the conventional flip-flop circuit. In addition, while the flip-flop circuit employing the MTCMOS technology in accordance with the present invention has an operation speed slightly slower than that of the prior art flip-flop circuit employing the low-Vth transistor or the high-Vth transistor, a leakage current of the present invention is significantly smaller than that of the conventional art.

22 Claims, 4 Drawing Sheets

MTCMOS FLIP-FLOP CIRCUIT CAPABLE OF RETAINING DATA IN SLEEP MODE

This U.S. nonprovisional patent application claims priority under 35 U.S.C. § 119 of Korean Patent Application 2002-68932 filed on Nov. 7, 2002, the entire contents of which are hereby incorporated by reference.

BACKGROUND OF THE INVENTION

1. Field of the Invention

The present invention relates to a flip-flop circuit employing an MTCMOS technology and, more particularly, to a flip-flop circuit employing an MTCMOS technology capable of retaining a former state of sleep mode when the state of the system is converted from sleep mode to active mode.

2. Description of the Related Art

An MTCMOS (Multi-Threshold Complementary Metal Oxide Semiconductor) technology is advantageous for improving an operation speed of a logic circuit 10 as shown in FIG. 1, by supplying a power supply voltage (or ground voltage) to the logic circuit 10 having a relatively low Vth (threshold voltage) as a MOS (Metal Oxide Semiconductor) transistor MP1 or MN1 is turned on in active mode, i.e., in power on mode, and for decreasing a leakage current or sub-threshold current of the logic circuit by cutting off the power supply voltage (or the ground voltage) to the logic circuit as the MOS transistor is turned off in sleep mode. The MOS transistor MP1 or MN1 having a relatively high Vth is connected in series between the power supply voltage (or the ground voltage) and the logic circuit 10. The MTCMOS technology is especially useful to decrease power consumption of an LSI (Large Scale Integration) chip for mobile applications in which the time in sleep mode is substantially longer than that in active mode. However, the MTCMOS technology has a problem that data stored in a latch or a flip-flop of the logic circuit in power off mode, i.e., sleep mode are lost. In the flip-flop circuit employing the MTCMOS technology, various circuits, which have solved the data loss problem in sleep mode, have been disclosed. FIG. 2 illustrates a prior art D type flip-flop circuit capable of retaining data in sleep mode, which is disclosed in IEEE JOURNAL OF SOLID STATE CIRCUIT, Vol. 32, No. 6, Satoshi Shigematsu, 1997. The D type flip-flop circuit shown in FIG. 2 is provided with a data keeper 230 for storing data in sleep mode and outputting the stored data in sleep mode to a master latch unit 210 and a slave latch unit 220 when the state of the system is restored to active mode so that an output of the flip-flop circuit retains a former state. In the circuit in FIG. 2, the logic circuit units 210 and 220 employ a low Vth transistor to increase an operation speed and the data keeper 230 uses a high Vth transistor to decrease a leakage current. In addition, the data keeper 230 is directly connected to the power supply voltage and the ground since it should be operated in sleep mode.

However, the prior art D type flip-flop circuit as shown in FIG. 2 have difficulties that the data keeper 230 should be additively inserted in the circuit to retain the data, data retaining control signals B1, B1B, B2 and B2B should be used to control a data read/write operation due to a co-relationship of a former clock signal and data on the conversion from sleep mode to active mode, and a control circuit for controlling these data retaining control signals should be performed in a top level of the circuit design step.

SUMMARY OF THE INVENTION

In accordance with the present invention to solve the above-mentioned problems, a flip-flop circuit employing an MTCMOS technology is capable of retaining a state just before the sleep mode when the state of the system is converted from sleep mode to active mode by using a sleep mode control signal by means of adding a feedback circuit to the conventional flip-flop circuit.

An object of the present invention is to provide a flip-flop circuit employing an MTCMOS technology capable of retaining a state just before the sleep mode when the state of the system is converted from sleep mode to active mode.

An MTCMOS flip-flop circuit in accordance with the present invention comprises a master latch unit and a slave latch unit, for latching input data and outputting the data under the control of an internal clock signal, wherein an output of the flip-flop circuit retains a state just before the admission to sleep mode when the state of the system is converted from sleep mode to active mode by means of making a data state of an input terminal of a master latch circuit into the same state as an inversed data state of an input terminal of a slave latch circuit in sleep mode and storing the data state of the input terminal of the master latch circuit.

An MTCMOS flip-flop circuit in accordance with the present invention is characterized in that the MTCMOS flip-flop circuit comprises a switching transistor connected between a virtual ground and a ground, which is turned on by a sleep mode control signal in sleep mode and turned off by the sleep mode control signal in active mode.

An MTCMOS flip-flop circuit in accordance with the present invention is characterized in that the MTCMOS flip-flop circuit comprises a data retention feedback circuit for inverting data from the input terminal of the slave latch circuit under the control of an inverted sleep mode control signal, and outputting the data to the input terminal of the master latch circuit, thereby retaining a state just before the admission to sleep mode of an output of the flip-flop circuit when the state of the system is converted from sleep mode to active mode.

The data retention feedback circuit is characterized in that the data retention feedback circuit comprises a first inverter for inverting the inverted sleep mode control signal; a first PMOS transistor having a source terminal connected to a power supply voltage, and a gate terminal to which an output signal of the first inverter is applied; a second PMOS transistor having a source terminal connected to a drain terminal of the first PMOS transistor, a gate terminal connected to the input terminal of the slave latch circuit for receiving a feedback input signal, and a drain terminal connected to the input terminal of the master latch circuit for outputting a feedback output signal; a first NMOS transistor having a drain terminal connected to a drain terminal of the second PMOS transistor, and a gate terminal connected to a gate terminal of the second PMOS transistor; and a second NMOS transistor having a drain terminal connected to the source terminal of the first NMOS transistor, and a source terminal connected to a ground of the gate terminal to which the inverted sleep mode control signal is applied.

The MTCMOS flip-flop circuit of the present invention is characterized in that the master latch unit is consisted of a high-Vth transistor, and the slave latch unit is consisted of a low-Vth transistor.

The MTCMOS flip-flop circuit in accordance with the present invention is characterized in that the circuit is provided with a sleep mode control circuit for retaining the clock signal in low state regardless of an external clock signal in sleep mode, and outputting an inverted signal of the external clock signal as the internal clock signal in active mode.

The sleep mode control circuit is characterized in that the sleep mode control circuit comprises a first PMOS transistor having a source terminal connected to a power supply voltage, and a gate terminal for receiving an inverted sleep mode control signal; a second PMOS transistor having a source terminal connected to the drain terminal of the first PMOS transistor, a gate terminal for receiving an external clock signal, and a drain terminal connected to a first node; a first NMOS transistor having a drain terminal connected to the first node, a gate terminal for receiving the external clock signal, and a source terminal connected to a ground; and a second NMOS transistor having a drain terminal connected to the first node, a gate terminal for receiving the inverted sleep mode control signal, and a source terminal connected to a ground, wherein the first node generates the internal clock signal.

The MTCMOS flip-flop circuit of the present invention is characterized in that the first PMOS transistor is a high-Vth transistor, and the second PMOS transistor, the first NMOS transistor and the second NMOS transistor are low-Vth transistor.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENT

Hereinafter, the detailed description of a flip-flop circuit employing an MTCMOS technology in accordance with the present invention will be described in connection with the accompanying drawings.

Figure 1:
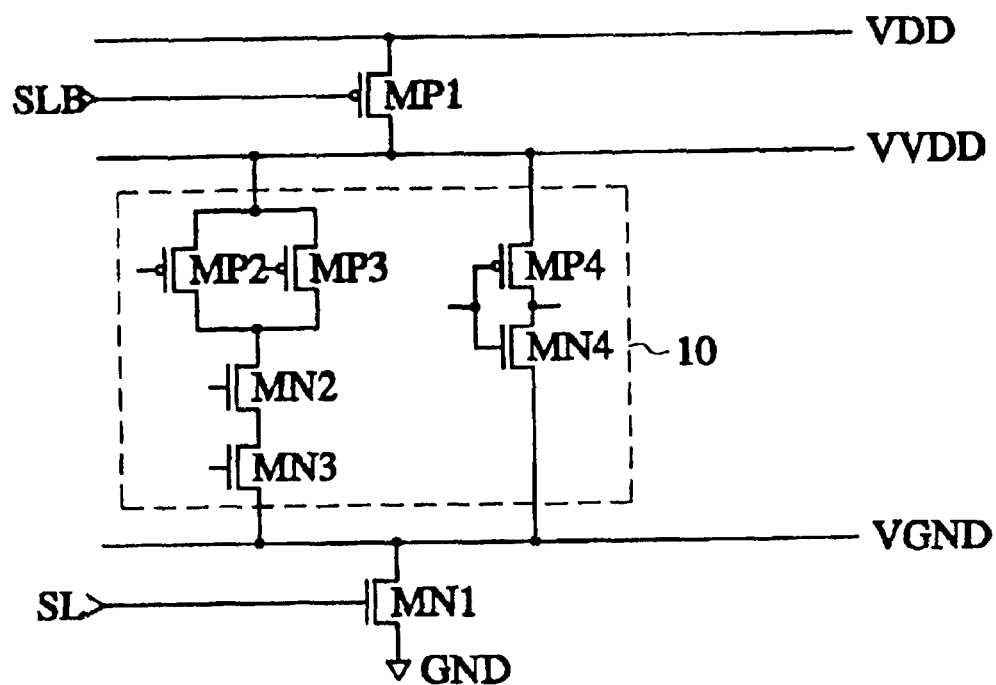
FIG. 1 is a circuit diagram generally illustrating a part of a logic circuit designed by employing an MTCMOS technology.
Figure 2:
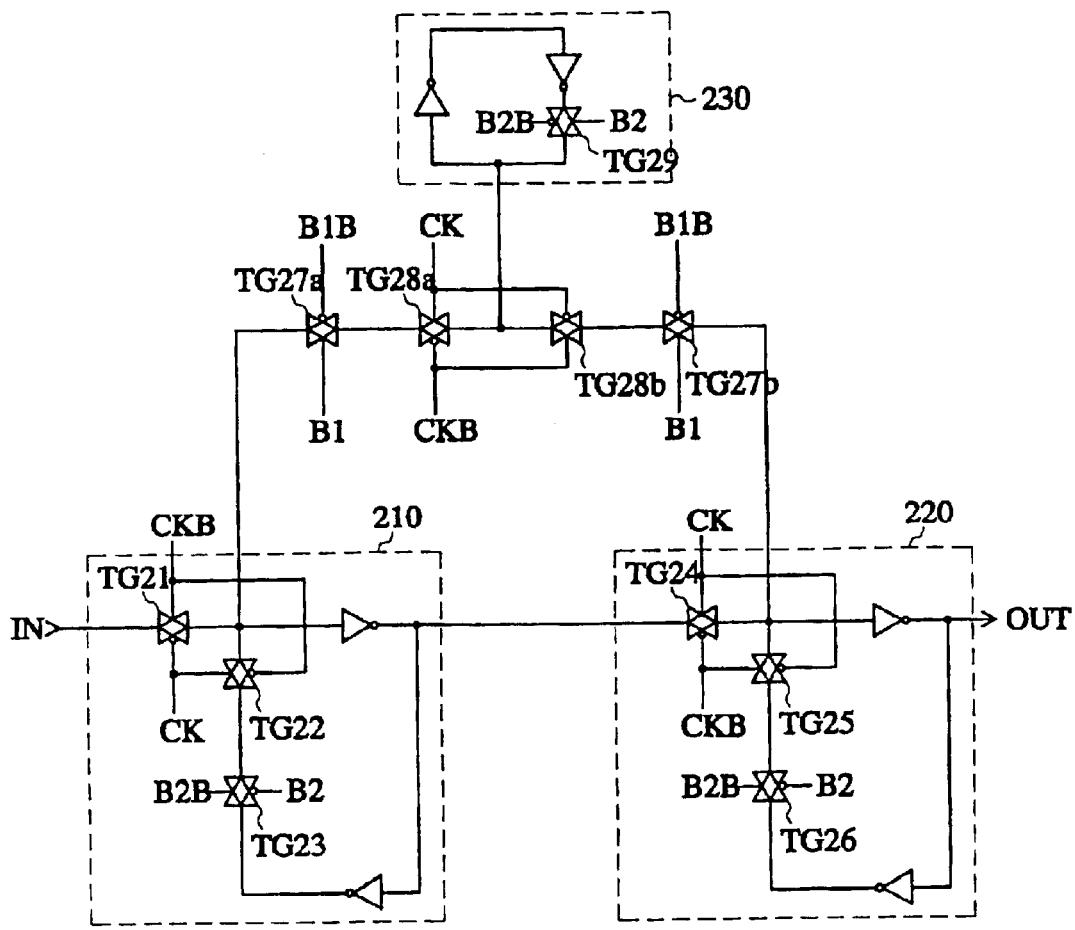
FIG. 2 is a diagram illustrating a prior art MTCMOS flip-flop circuit capable of retaining data in sleep mode.
Figure 2:
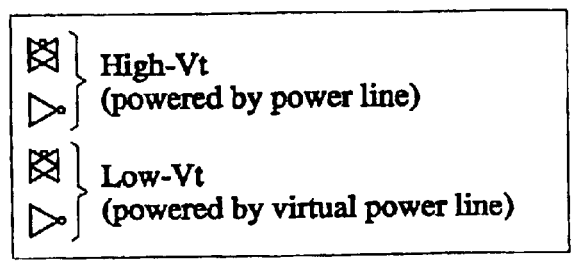
Figure 3:
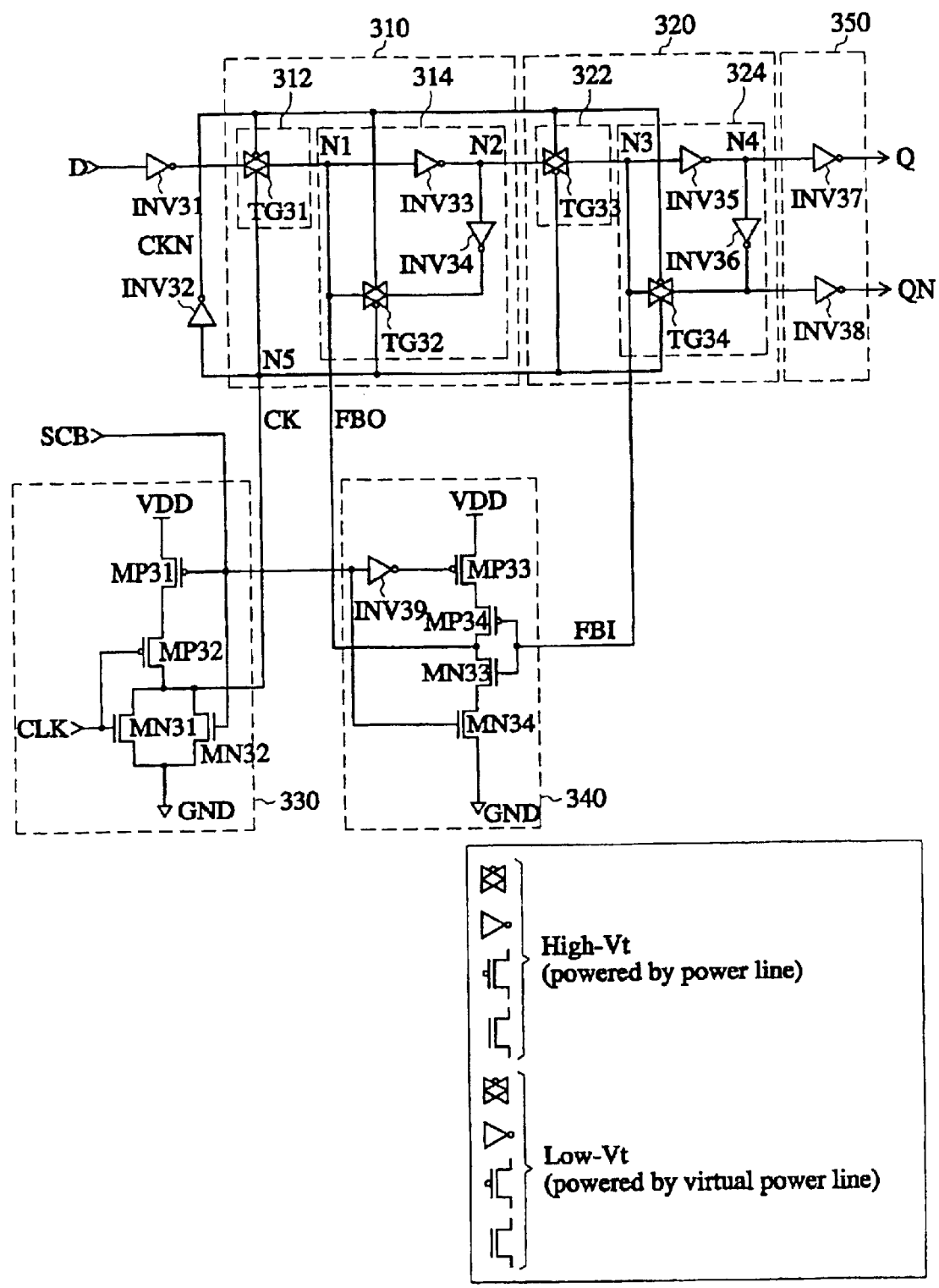
FIG. 3 is a diagram illustrating an MTCMOS flip-flop circuit in accordance with an embodiment of the present invention capable of retaining data in sleep mode.
Figure 4:
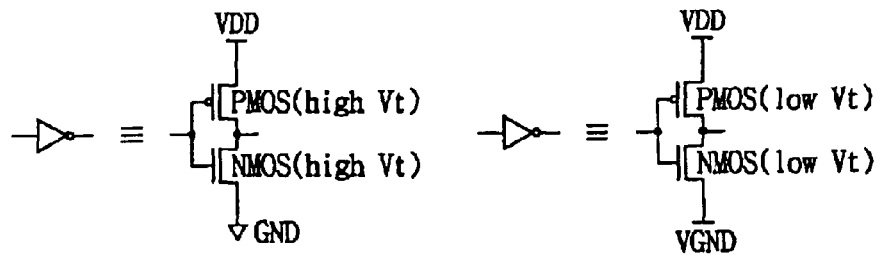
FIG. 4 is a diagram illustrating inverters in the circuit shown in FIG. 3 as equivalent transistors.
Figure 5:
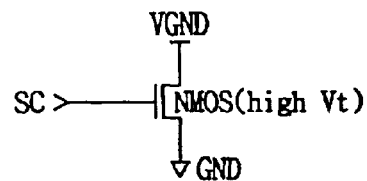
FIG. 5 is a diagram illustrating a switching transistor connected between a virtual ground VGND (not shown) and a ground GND of the circuit n FIG. 3.

FIG. 3 is a diagram illustrating an MTCMOS flip-flop circuit in accordance with an embodiment of the present invention capable of retaining data in sleep mode. FIG. 4 is a diagram illustrating inverters in the circuit shown in FIG. 3 as equivalent transistors, and FIG. 5 is a diagram illustrating an NMOS transistor connected between a virtual ground VGND and a ground GND in the circuit shown in FIG. 3. While the virtual ground VGND is not shown in FIG. 3, inverters INV31, INV35, INV36, INV37 and INV38 are actually connected to the virtual ground VGND as shown in FIG. 4, and the switching transistor is connected between the virtual ground VGND and the ground GND as shown in FIG. 5.

The MTCMOS flip-flop circuit in accordance with an embodiment of the present invention shown in FIG. 3 comprises a sleep mode control circuit 330 for receiving an external clock signal CLK and an inverted sleep mode control signal SCB, and generating an internal clock signal CK; an inverter INV31 for receiving an input signal D of a flip-flop and inverting it; an inverter INV32 for receiving the internal clock signal CK and inverting it, and generating an inverted internal clock signal CKN; a master latch unit 310 for receiving an output signal of the inverter INV31, latching it, and outputting it to a node N2 under the control of the internal clock signal CK and the inverted internal clock signal CKN; a slave latch unit 320 for receiving a signal of the node N2, latching it, and outputting it to a node N4; a data retention feedback circuit 340 for receiving a feedback input signal FBI from a node N3 under control of an inverted sleep mode control signal SCB and generating a feedback output signal FBO to the node N1; and a buffer 350.

The sleep mode control circuit 330 includes a PMOS (P-type MOS) transistor MP31 having a source terminal connected to a power supply voltage VDD, and a gate terminal for receiving an inverted sleep mode control signal SCB; a PMOS transistor MP32 having a source terminal connected to a drain terminal of the PMOS transistor MP31, a gate terminal for receiving an external clock signal CLK, and a drain terminal connected to a node N5; an NMOS transistor MN31 having a drain terminal connected to the node N5, a gate terminal for receiving an external clock signal CLK, and a source terminal connected to a ground GND; and an NMOS transistor MN32 having a drain terminal connected to the node N5, a gate terminal for receiving an inverted sleep mode control signal SCB, and a source terminal connected to a ground GND. An internal clock signal CK is generated at the node N5.

The master latch unit 310 includes a master latch gate 312 consisted of a transmitting gate TG31 for receiving an output signal of the inverter INV31 and transmitting it to the node N1 under the control of an internal clock signal CK and an inverted internal clock signal CKN, and a master latch circuit 314 for receiving an output signal of the master latch gate 312, latching it, and outputting it to the node N2.

The master latch circuit 314 includes an inverter INV33 for receiving a signal of the node N1, inverting it, and outputting it to the node N2; an inverter INV34 for receiving a signal of the node N2 and inverting it, and a transmitting gate TG32 for receiving an output signal of the inverter INV34 and transmitting it to the node N1 under the control of an internal clock signal CK and an inverted internal clock signal CKN.

The slave latch unit 320 includes a slave latch gate 322 consisted of a transmitting gate TG33 for receiving a signal of the node N2 and transmitting it to a node N3 under the control of an internal clock signal CK and an inverted internal clock signal CKN; and a slave latch circuit 324 for receiving an output signal of the slave latch gate 322, latching it, and outputting it to a node N4.

The slave latch circuit 324 includes an inverter INV35 for receiving a signal of the node N3, inverting it, and outputting it to the node N4; an inverter INV36 for receiving a signal of the node N4 and inverting it; and a transmitting gate TG34 for receiving an output signal of the inverter INV36 and transmitting it to the node N3 under the control of an internal clock signal CK and an inverted internal clock signal CKN.

The data retention feedback circuit 340 includes an inverter INV39 for receiving an inverted sleep mode control signal SCB and inverting it; a PMOS transistor MP33 having a source terminal connected to a power supply voltage VDD, and a gate terminal to which an output signal of the inverter INV39 is applied; a PMOS transistor MP34 having a source terminal connected to a drain terminal of the PMOS transistor MP33, a gate terminal, connected to the node N3, for receiving a feedback input signal FBI, and a drain terminal, connected to the node N1, for outputting a feedback output signal FBO; an NMOS transistor MN33 having a drain terminal connected to the drain terminal of the PMOS transistor MP34, and a gate terminal connected to the gate terminal of the PMOS transistor MP34; and an NMOS transistor MN34 having a drain terminal connected to a source terminal of the NMOS transistor MN33, a gate terminal to which an inverted sleep mode control signal SCB is applied, and a source terminal connected to a ground GND.

The buffer 350 is provided with an inverter INV37 and an inverter INV38, for receiving an output signal of the slave latch unit 320, buffering it, and generating an inverted final output signal Q and QN.

In an embodiment of the present invention shown in FIG. 3, inverters INV31, INV35, INV36, INV37 and INV38, and a transmitting gate TG33, which significantly affect an operation speed of the flip-flop, are consisted of low-Vth transistors to prevent an operation speed of the flip-flop from lowering.

Figure 6:
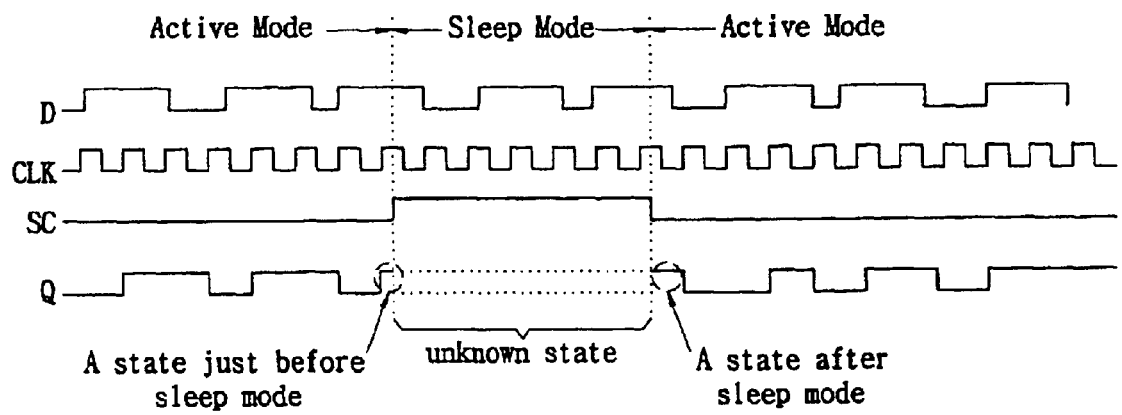
FIG. 6 is a timing diagram of the circuit in FIG. 3 illustrating that a former state of sleep mode is retained on the conversion from sleep mode to active mode.

FIG. 6 is a timing diagram of the circuit in FIG. 3 illustrating that a former state of sleep mode is retained on the conversion from sleep mode to active mode.

Hereinafter, an operation of the flip-flop circuit employing an MTCMOS technology in accordance with the present invention will be explained referring to FIG. 3~FIG. 6.

When the flip-flop circuit in FIG. 3 is operated in active mode, i.e., when a sleep mode control signal SC is in high state, and an inverted sleep mode control signal SCB is in low state, a switching transistor NMOS shown in FIG. 5 becomes "on" to connect a virtual ground to a ground, and low-Vth transistors are normally operated. Since the inverted sleep mode control signal SCB is in low state, in FIG. 3, the PMOS transistor MP31 becomes turn-on state, and the NMOS transistor MN32 becomes turn-off state. In this condition, the sleep mode control circuit 330 has a function of inverter consisted of the PMOS transistor MP32 and the NMOS transistor MN31, thereby inverting an external clock signal CLK and generating an internal clock signal CK. On the other hand, in this condition, since the PMOS transistor MP33 and the NMOS transistor MN34 become turn-off state, a power supply is not supplied to the data retention feedback circuit 340. Thus, the data retention feedback circuit 340 does not affect an operation of the flip-flop circuit.

Therefore, in this condition, the flip-flop circuit employing the MTCMOS technology in FIG. 3 is operated as a general D-type flip-flop circuit, and the master latch unit 310 and the slave latch unit 320 is operated to latch an input signal D and send it under the control of an external clock signal CLK.

A mechanism of data transition of the flip-flop is as follows. When an external clock signal CLK is in low state, the transmitting gates TG31 and TG34 become "on", and the transmitting gates TG32 and TG33 become "off". Thus, variations of input data are transmitted only to the node N2 of the master latch unit 310, and the data of a former state are latched and output in the slave latch unit 320. When an external clock signal CLK becomes high state, the transmitting gates TG31 and TG34 become "off", and the transmitting gates TG32 and TG33 become "on". Thus, a signal of the node N2 before an external clock signal CLK becomes high state is latched at the master latch unit 310, thereby being output as output data Q of the flip-flop through the transmitting gate TG33 and the inverters INV35 and INV37.

As described hereinabove, the transmitting gates TG31 and TG32 and inverters INV33 and INV34 mainly accomplish a function of latching a current data state at an edge of clock signal, and the transmitting gate TG33 and the inverters INV31, INV35, INV36, INV37 and INV38 mainly affect the operation speed of the flip-flop. Therefore, in the present invention, the transmitting gate TG33 and the inverters INV31, INV35, INV36, INV 37 and INV38 are consisted of a low-Vth transistor to prevent an operation speed of the flip-flop from lowering. In addition, Since the sleep mode control circuit 330 accomplishes a function of converting an external clock signal CLK to an internal clock signal CK and affects the operation speed of the flip-flop, Only the PMOS transistor MP31 is consisted of a high-Vth transistor, and the PMOS transistor MP32, the NMOS transistor MN31 and MN32 are consisted of a low-Vth transistor.

When the flip-flop circuit of FIG. 3 operates in sleep mode, i.e., when a sleep mode control signal SC is in low state, and an inverted sleep mode control signal SCB is in high state, the switching transistor NMOS shown in FIG. 5 becomes "off" to cut off a connection between the virtual ground VGND and the ground GND. Thus, the low-Vth transistors are getting into a floating state. Since the inverted sleep mode control signal SCB is in high state, as shown in FIG. 3, the PMOS transistor MP31 becomes "off", and the NMOS transistor MN32 becomes "on". Thus, an internal clock control signal CK, which is output of the sleep mode control circuit 330, does not vary depending upon an external clock signal CLK any more. Meanwhile, in this condition, since the PMOS transistor MP33 and the NMOS transistor MN34 become "on", the data retention feedback circuit 340 operates as an inverter. Since an internal clock signal CK, which is an output signal of the sleep mode control circuit 330, is in low state, the transmitting gates TG31 and TG34 become "off", and the transmitting gates TG32 and TG33 become "on". Thus, the master latch circuit 314 latches data which it had just before sleep mode, and the slave latch circuit 324 cannot accomplish a function of latch as the transmitting gate TG34 becomes "off". In this condition, since the data retention feedback circuit 340 operates, a signal of the node N3 is inverted by the data retention feedback circuit 340 and feedbacks to the node N1. The signal of the node N1 is inverted by the inverter INV33 to be transmitted to the node N2, and the signal of the node N2 is transmitted to the node N3 through the transmitting gate TG33, thereby retaining the signal of the node N3 just before sleep mode during sleep mode. Since the data retention feedback circuit 340 accomplishes a function of an inverter, when a data value at an input terminal (node N1) of the master latch circuit 314 just before sleep mode is equal to a data value at an input terminal (node N3) of the slave latch circuit 324, a conflict of the data may be occurred at the node N1. To prevent the data from conflicting, the data retention feedback circuit 340 is designed to have a driving strength greater than that of the inverter INV34 of the master latch unit 310. As a result, a value of the feedback output signal FBO of an inverted data of the input terminal (node N3) of the slave latch circuit 324 can override a data value of the input terminal (node N1) of the master latch circuit 314. The reason for equalizing the data value of the input terminal (node N1) of the master latch circuit (314) and the value of the feedback output signal FBO of an inverted data of the input terminal (node N3) of the slave latch circuit 324 by the data retention feedback circuit is that a status of the output signal Q of the flip-flop and a status just before sleep mode may be different to each other depending upon a status of the clock signal and a status of data of the master latch circuit 314 when the state of the system is converted from sleep mode to active. For example, in case of admission into sleep mode in the state that the input terminal (node N3) of the slave latch circuit 324 have a data in high state, the external clock signal CLK is in low state, and input data D of the flip-flop is in low state, a status of data of the input terminal (node N1) of the master latch circuit 314 and a status of data of the input terminal (node N3) of the slave latch circuit 324 become different to each other. Then, when the external clock signal CLK is in high state when the state of the system is converted from sleep mode to active mode, a state of data of the input terminal (node N1) of the master latch circuit 314, i.e., low state, is transmitted to the slave latch circuit. Thus, it is impossible to retain a state just before sleep mode, i.e., high state.

In an embodiment of the present invention, when the state of the system is converted from sleep mode to active mode, a synchronization of the sleep mode control signal SC and the inverted sleep mode control signal SCB equalizes a status of data of the input terminal (node N1) of the master latch circuit 314 and a status of the feedback output signal FBO of the inverted data of the input terminal (node N3) of the slave latch circuit 324. As a result, a status of output signal of the flip-flop retains the status just before sleep mode regardless of a status of clock signal when the state of the system is converted from sleep mode to active mode.

Since the PMOS transistor MP31 becomes "off" in sleep mode, there is no cut-off circuit path likely to be resulted from unknown state of an external clock signal CLK. In addition, since the transmitting gate TG34 becomes "off", there is no cut-off circuit path due to a status of output terminals of the node N4 and the inverter INV36. Therefore, there is no cut-off circuit path due to an unknown state of input signal in the flip-flop circuit employing the MTCMOS technology in accordance with the present invention.

In the circuit shown in FIG. 3, off-state transistors that affect a leakage current are MP31, MP34, MN33, TG31, TG34, and NMOS transistors of INV32 and INV39. PMOS transistors or NMOS transistors of INV35 and INV36 become off state depending upon the status of nodes. Since all of these transistors are consisted of high-Vth transistors, a leakage current thereof is significantly smaller than that of low-Vth transistors. Therefore, power consumption in sleep mode becomes very small. Meanwhile, since the switching transistor cuts off a connection between the virtual ground and the ground in sleep mode, there is no leakage current by the low-Vth transistor in the circuit shown in FIG. 3.

When the flip-flop circuit shown in FIG. 3 is converted from sleep mode to active mode, i.e., when the sleep mode control signal SC is in high state and the inverted sleep mode control signal SCB is in low state, an operation of the circuit is as follows.

By means of the sleep mode control signal SC and the inverted sleep mode control signal SCB, the sleep mode control circuit 330 accomplishes a function of an inverter, and the data retention feedback circuit 340 does not operate. Data of the input terminal (node N1) of the master latch circuit 314 have a status just before the conversion to active mode. In the state converted to active mode, when the external clock signal CLK is in high state, data retained in the master latch circuit are output as an output signal Q and QN. Further, when the external clock signal CLK is in low state, the transmitting gates TG31 and TG34 become "on", and the transmitting gates TG32 and TG33 become "off". As a result, a status of input data D on the conversion from sleep mode to active mode is transmitted to the node N3, and a status of the node N3 in sleep mode is latched at the slave latch circuit 324 and output as output data Q and QN through the buffer circuit 350. As described hereinabove, the flip-flop circuit employing the MTCMOS technology in accordance with the present invention retains data on the conversion from sleep mode to active mode regardless of a status of a former clock signal.

A timing diagram in FIG. 6 illustrates that the flip-flop circuit employing the MTCMOS technology in accordance with the present invention shown in FIG. 3 is retaining an output state just before sleep mode on the conversion from sleep mode to active mode.

Table 1 is a comparable table of an operation speed and a leakage current of a prior art D-type flip-flop circuit and a D-type flip-flop circuit in accordance with the present invention shown in FIG. 3. As described in table 1, while the flip-flop circuit of the present invention has an operation speed slower about 5% than that of the prior art flip-flop circuit employing the low-Vth transistor only, a leakage current of the present invention is decreased to 1/67 of that of the prior art. Also, since the D-type flip-flop circuit of the present invention employs the MTCMOS technology, its leakage current is smaller than that of the prior art D-type flip-flop circuit employing the high-Vth transistor only.

TABLE 1

| Item | The present invention | Low-Vth DFlip-flop | High-Vth DFlip-flop |
|---|---|---|---|
| Operation speed | 1 | 0.954 | 1.27 |
| Leakage current | 1 | 67.79 | 2.42 |

As described hereinabove, the flip-flop circuit employing the MTCMOS technology in accordance with the present invention is capable of retaining a former state of sleep mode on the conversion from sleep mode to active mode by using the sleep mode control signal by means of adding the feedback circuit to the prior art flip-flop circuit. In addition, while the flip-flop circuit of the present invention has an operation speed slightly slower than that of the prior art flip-flop circuit employing the low-Vth transistor or the high-Vth transistor, a leakage current of the present invention is significantly smaller than that of the prior art.

While this invention has been described in connection with what is presently considered to be the most practical and preferred embodiment, it is to be understood that the invention is not limited to the disclosed embodiment, but on the contrary, it is intended to cover various modification within the spirit and scope of the appended claims.

What is claimed is:

1. An MTCMOS flip-flop circuit, comprising:
   a master latch unit to latch input data and output the data under the control of an internal clock;
   a slave latch unit for latching input data and outputting the data under the control of an internal clock signal;
   wherein an output of the flip-flop circuit retains a state just before admission to a sleep mode when the state of the system is converted from sleep mode to an active mode by means of making a data state of an input terminal of the master latch circuit into the same state as an inversed data state of an input terminal of the slave latch circuit in sleep mode and storing the data state of the input terminal of the master latch circuit.

2. The MTCMOS flip-flop circuit according to claim 1, wherein the MTCMOS flip-flop circuit comprises a switching transistor connected between a virtual ground and a ground, which is turned on by a sleep mode control signal in sleep mode and turned off by the sleep mode control signal in active mode.

3. The MTCMOS flip-flop circuit according to claim 1, wherein the MTCMOS flip-flop circuit comprises a data retention feedback circuit for inverting data from the input terminal of the slave latch circuit under the control of an inverted sleep mode control signal, and outputting the data to the input terminal of the master latch circuit, thereby retaining a state just before the admission to sleep mode of an output of the flip-flop circuit when the state of the system is converted from sleep mode to active mode.

4. The MTCMOS flip-flop circuit according to claim 3, wherein the data retention feedback circuit comprises:
   a first inverter for inverting the inverted sleep mode control signal;
   a first PMOS transistor having a source terminal connected to a power supply voltage, and a gate terminal to which an output signal of the first inverter is applied;
   a second PMOS transistor having a source terminal connected to a drain terminal of the first PMOS transistor, a gate terminal connected to the input terminal of the slave latch circuit for receiving a feedback input signal, and a drain terminal connected to the input terminal of the master latch circuit for outputting a feedback output signal;
   a first NMOS transistor having a drain terminal connected to a drain terminal of the second PMOS transistor, and a gate terminal connected to a gate terminal of the second PMOS transistor; and
   a second NMOS transistor having a drain terminal connected to the source terminal of the first NMOS transistor, and a source terminal connected to a ground of the gate terminal to which the inverted sleep mode control signal is applied.

5. The MTCMOS flip-flop circuit according to claim 1, wherein the master latch unit is consisted of a high-Vth transistor, and the slave latch unit is consisted of a low-Vth transistor.

6. The MTCMOS flip-flop circuit according to claim 1, wherein the internal clock signal does not oscillate depending upon the external clock signal in sleep mode, and oscillates in response to the external clock signal in active mode.

7. The MTCMOS flip-flop circuit according to claim 1, wherein the MTCMOS flip-flop circuit is provided with a sleep mode control circuit for retaining the clock signal in low state regardless of an external clock signal in sleep mode, and outputting an inverted signal of the external clock signal as the internal clock signal in active mode.

8. The MTCMOS flip-flop circuit according to claim 7, wherein the sleep mode control circuit comprises:
   a first PMOS transistor having a source terminal connected to a power supply voltage, and a gate terminal for receiving an inverted sleep mode control signal;
   a second PMOS transistor having a source terminal connected to the drain terminal of the first PMOS transistor, a gate terminal for receiving an external clock signal, and a drain terminal connected to a first node;
   a first NMOS transistor having a drain terminal connected to the first node, a gate terminal for receiving the external clock signal, and a source terminal connected to a ground; and
   a second NMOS transistor having a drain terminal connected to the first node, a gate terminal for receiving the inverted sleep mode control signal, and a source terminal connected to a ground, wherein the first node generates the internal clock signal.

9. The MTCMOS flip-flop circuit according to claim 8, wherein the first PMOS transistor is a high-Vth transistor, and the second PMOS transistor, the first NMOS transistor and the second NMOS transistor are low-Vth transistor.

10. An MTCMOS flip-flop circuit comprising:
    a sleep mode control circuit for receiving an external clock signal and an inverted sleep mode control signal and generating an internal clock signal;
    a first inverter for inverting flip-flop input data;
    a master latch gate for receiving an output signal of the first inverter and transmitting to a first node under control of the internal clock signal and the inverted internal clock signal;
    a master latch circuit for receiving and latching an output signal of the master lach gate and outputting the signal to a second node;
    a slave latch gate for receiving a signal of the second node and transmitting the signal to a third node under the control of the internal clock signal and the inverted clock signal;
    a slave latch circuit for receiving and latching an output signal of the slave latch gate, and outputting the signal to a fourth node; and
    a data retention feedback circuit for receiving a feedback input signal from the third node under control of the inverted sleep mode control signal and transmitting the feedback output signal to the first node.

11. The MTCMOS flip-flop circuit according to claim 10, wherein the MTCMOS flip-flop circuit is further provided with a switching transistor connected between a virtual ground and a ground, which is turned on by a sleep mode control signal in sleep mode and turned off by the sleep mode control signal in active mode.

12. The MTCMOS flip-flop circuit according to claim 10, wherein the MTCMOS flip-flop circuit is further provided with a buffer circuit for inverting an output signal of the slave latch circuit, and buffering the signal, and generating a flip-flop output signal.

13. The MTCMOS flip-flop circuit according to claim 10, wherein the data retention feedback circuit comprises:
    a first inverter for receiving the inverted sleep mode control signal and inverting the signal;
    a first PMOS transistor having a source terminal connected to a power supply voltage, and a gate terminal which an output signal of the first inverter is applied;
    a second PMOS transistor having a source terminal connected to a drain terminal of the first PMOS transistor, a gate terminal, connected to the input terminal of the slave latch circuit, for receiving a feedback input signal, and a drain terminal, connected to the input terminal of the master latch circuit, for outputting a feedback output signal;
    a first NMOS transistor having a drain terminal connected to the drain terminal of the second PMOS transistor, and a gate terminal connected to the gate terminal of the second PMOS transistor; and a second NMOS transistor having a drain terminal connected to the source terminal of the first NMOS transistor, and a source terminal connected to a ground of the gate terminal which the inverted sleep mode control signal is applied.

14. The MTCMOS flip-flop circuit according to claim 10, wherein the sleep mode control circuit comprises:

a first PMOS transistor having a source terminal connected to a power supply voltage, and a gate terminal for receiving an inverted sleep mode control signal;

a second PMOS transistor having a source terminal connected to the drain terminal of the first PMOS transistor, a gate terminal for receiving the external clock signal, and a drain terminal connected to a fifth node;

a first NMOS transistor having a drain terminal connected to the fifth node, a gate terminal for receiving the external clock signal, and a source terminal connected to a ground; and a second NMOS transistor having a drain terminal connected to the fifth node, a gate terminal for receiving the inverted sleep mode control signal, and a source terminal connected to a ground, wherein the fifth node generates the internal clock signal.

15. The MTCMOS flip-flop circuit according to claim 11, wherein the master latch gate is a first transmitting gate consisted of a high-Vth transistor, and the master latch gate becomes "on" when the internal clock signal is in high state.

16. The MTCMOS flip-flop circuit according to claim 11, wherein the master latch circuit comprises:

a second inverter for inverting a signal of the first node, and outputting the signal to the second node;

a third inverter for inverting a signal of the second node; and a second transmitting gate for receiving an output signal of the third inverter and transmitting the signal to the first node under the control of the internal clock signal and the inverted internal clock signal.

17. The MTCMOS flip-flop circuit according to claim 16, wherein the second transmitting gate becomes "on" when the internal clock signal is in low state.

18. The MTCMOS flip-flop circuit according to claim 16, wherein the second transmitting gate, the second inverter and the third inverter are consisted of a high-Vth transistor.

19. The MTCMOS flip-flop circuit according to claim 10, wherein the slave latch gate is a third transmitting gate consisted of a low-Vth transistor, and the slave latch gate becomes "on" when the internal clock signal is in high state.

20. The MTCMOS flip-flop circuit according to claim 10, wherein the slave latch circuit comprises:

a fourth inverter for inverting a signal of the third node, and outputting the signal to the fourth node;

a fifth inverter for inverting a signal of the fourth node; and a fourth transmitting gate for receiving an output signal of the fifth inverter and transmitting the signal to the third node under the control of the internal clock signal and the inverted internal clock signal.

21. The MTCMOS flip-flop circuit according to claim 20, wherein the fourth transmitting gate becomes "on" when the internal clock signal is in high state.

22. The MTCMOS flip-flop circuit according to claim 20, wherein the second transmitting gate is consisted of a high-Vth transistor, and the fourth inverter and the fifth inverter are consisted of a low-Vth transistor.

* * * * *